United States Patent
Yamaguchi et al.

(10) Patent No.: US 6,506,869 B2
(45) Date of Patent: Jan. 14, 2003

(54) ONE-PACK TYPE EPOXY RESIN COMPOSITION AND CURED EPOXY RESIN

(75) Inventors: Hiroaki Yamaguchi, Tokyo (JP); Masafumi Kohda, Chiba (JP)

(73) Assignee: Ube Industries, Ltd., Ube (JP)

( * ) Notice: Subject to any disclaimer, the term of this patent is extended or adjusted under 35 U.S.C. 154(b) by 0 days.

(21) Appl. No.: 09/961,313

(22) Filed: Sep. 25, 2001

(65) Prior Publication Data

US 2002/0061971 A1 May 23, 2002

(30) Foreign Application Priority Data

Sep. 26, 2000 (JP) ........................................ 2000-291885
Nov. 22, 2000 (JP) ........................................ 2000-355172

(51) Int. Cl.⁷ .............................................. C08G 77/38
(52) U.S. Cl. .................... 528/27; 257/791; 257/793; 428/620
(58) Field of Search ........................... 528/27; 428/620; 257/791, 793

(56) References Cited

U.S. PATENT DOCUMENTS 5,252,703 A * 10/1993 Nakajima ................... 525/423

FOREIGN PATENT DOCUMENTS

JP  A 9-153570  6/1997

* cited by examiner

*Primary Examiner*—Robert Dawson
*Assistant Examiner*—D. Aylward
(74) *Attorney, Agent, or Firm*—Young & Thompson

(57) ABSTRACT

A one-pack type epoxy resin composition is desclosed. The composition comprises a low-viscosity epoxy resin and an acid anhydride hardener, and has a viscosity of 250 P or less at 25° C. The hardener is an imide oligomer comprising an imide unit and having an acid anhydride group at the terminal thereof. The imide unit is represented by formula I:

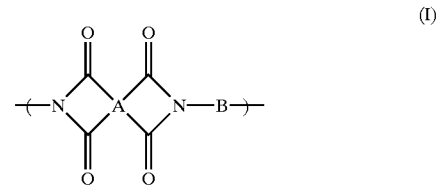

wherein A represents an asymmetric aromatic tetracarboxylic dianhydride residue or alicyclic tetracarboxylic dianhydride residue; and B represents a diaminopolysiloxane residue.

11 Claims, 1 Drawing Sheet

Fig. 1
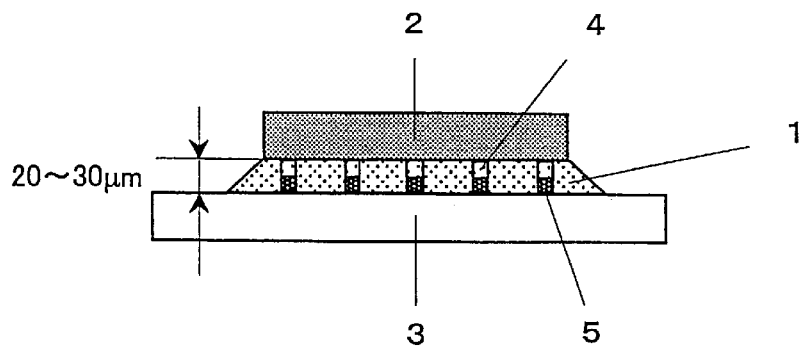
Fig. 2 (a)
Fig. 2 (b)
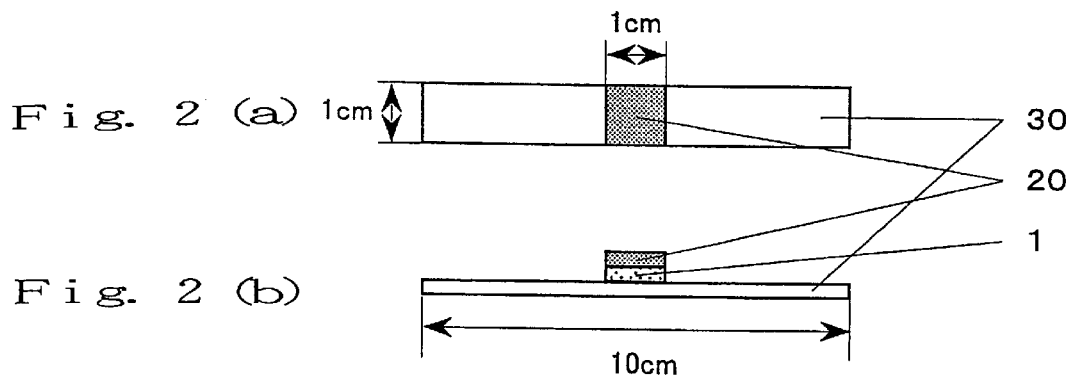
Fig. 3
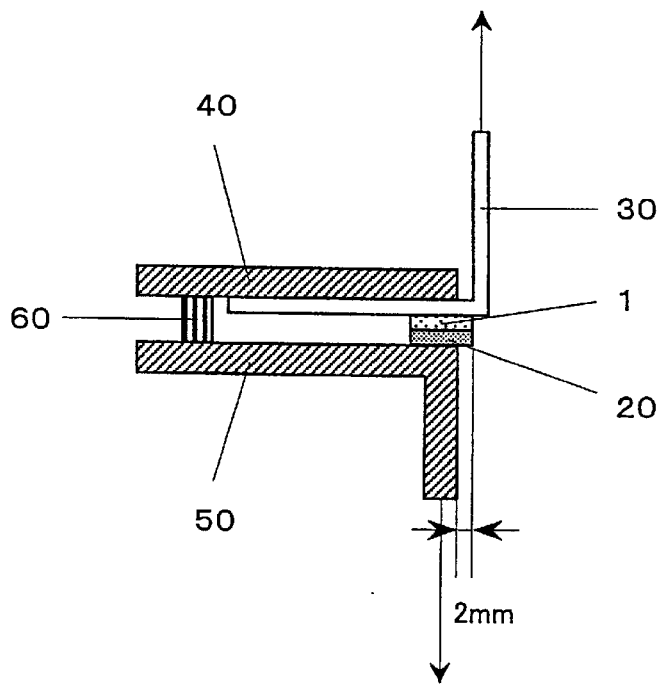

ONE-PACK TYPE EPOXY RESIN COMPOSITION AND CURED EPOXY RESIN

FIELD OF THE INVENTION

The present invention relates to a solventless one-pack type epoxy resin composition and a cured product thereof. More particularly, it relates to a solventless one-pack type epoxy resin composition comprising a low-viscosity epoxy resin and an acid anhydride hardener that is an imide oligomer having an imide unit and an acid anhydride group at the terminal, and a cured product obtained from the resin composition.

BACKGROUND OF THE INVENTION

As the level of integration of semiconductor chips increases, flip chip packages in which a chip and a substrate are connected via bumps have been taking the place of chip-on-board packages such as pin grid array packages in which a chip and a substrate are connected by wire bonding. Spot sealing of the flip chip packages is carried out by using, as an underfill sealant, a flowable solventless one-pack type epoxy resin composition.

With the increasing integration scale of circuits to be mounted, the substrates have also been changing from rigid materials such as glass-epoxy laminates to flexible films. However, conventionally employed underfill materials have insufficient adhesion to a polyimide film used in tape carrier packages due to their high elastic modulus and therefore insufficient reliability. JP-A-9-153570 proposes an underfill material containing butadiene rubber particles and thereby having a reduced elastic. modulus, but the butadiene rubber particles are difficult to disperse uniformly only to provide an underfill material with insufficient reliability in long term use.

SUMMARY OF THE INVENTION

An object of the present invention is to provide a solventless one-pack type epoxy resin composition which provides a cured resin having a small elastic modulus and good adhesion to both a silicon wafer and a polyimide film and which exhibits satisfactory molding properties such as a low viscosity and capability of penetrating in a relatively short time.

Another object of the present invention is to provide a cured resin having a low elastic modulus and a high adhesive strength.

The present invention relates to a one-pack type epoxy resin composition which comprises a low-viscosity epoxy resin and an acid anhydride hardener that is an imide oligomer comprising an imide unit and having an acid anhydride group at the terminal thereof, the imide unit being represented by formula I:

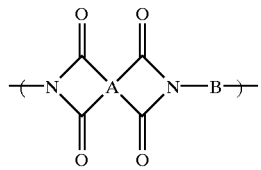

(I)

wherein A represents an asymmetric aromatic tetracarboxylic dianhydride residue or alicyclic tetracarboxylic dianhydride residue; and B represents a diaminopolysiloxane residue, and has a viscosity of 250 P or less at 25° C.

The present invention also relates to a cured resin obtained by thermally curing the above described one-pack type curable epoxy resin composition.

In this specification, "half-esterification" means esterification of tetracarboxylic dianhydride to dicarboxylic acid diester. "Penetrability", "penetration" and "penetrating" mean that the epoxy resin composition flows inwardly to fill a gap between a flip chip and a substrate due to the capillary phenomenon.

The preferred embodiments of the present invention will be, described below.

1) In the one-pack type epoxy resin composition, the acid anhydride hardener is an imide olygomer having an acid anhydride group at the terminal thereof and having an A moiety to B moiety molar ratio of 1.2 to 5.

2) In the one-pack type epoxy resin composition, the acid anhydride hardener is an imide oligomer having an acid anhydride group at the terminal thereof which is obtainable by once half-esterifying an asymmetric aromatic tetracarboxylic dianhydride or alicyclic tetracarboxylic dianhydride (A moiety) with an esterifying agent, particularly aliphatic alcohols having 4 or less carbon atoms, and then adding a diaminopolysiloxane (B moiety) to the reaction mixture at an A moiety to B moiety molar ratio of 1.2 to 5 to cause the reaction mixture to dehydrate until substantially no solvent remains in the reaction system.

3) In the one-pack type epoxy resin composition, the acid anhydride hardener is an imide oligomer having an acid anhydride group at the terminal thereof which is obtainable by using an alicyclic tetracarboxylic dianhydride represented by formula II:

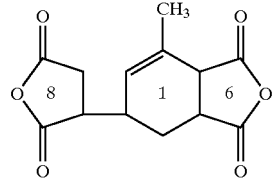

(II)

4) In the one-pack type epoxy resin composition, the acid anhydride hardener is present in an amount of 5% by weight or more, particularly 5–75% by weight based on the composition and of 1 equivalent or less, particularly 0.9–1.0 equivalent per equivalent of the total epoxy group content.

5) The one-pack type epoxy resin composition further comprises an alicyclic acid anhydride hardener, a phenolic resin hardener or both in such an amount that the total content of the functional groups of all hardeners is 1 equivalent or less, particularly 0.9–1.0 equivalent per equivalent of total epoxy group content of the low-viscosity epoxy resin.

6) The one-pack type, epoxy resin composition thermally cures to provide a cured resin having a tensile modulus of 200 kg/mm² or less, particularly 1–200 kg/mm², more particularly 1–150 kg/mm² at 25° C.

7) The one-pack type epoxy resin composition further comprises a silane coupling agent.

8) The one-pack type epoxy resin composition is used as an underfill material for an electronic component.

BRIEF DESCRIPTION OF THE DRAWINGS

The present invention will be more particularly described with reference to the accompanying drawings, in which:

FIG. 1 is a schematic illustration of a semiconductor chip, sealed with a solventless one-pack type epoxy resin composition of the present invention as an underfill material;

FIG. 2 is a schematic illustration of a specimen prepared in Examples to evaluate adhesive strength of a cured epoxy, resin of the present invention as an underfill material; FIG. 2(a) is a plan view of the specimen; FIG. 2(b) is a cross-sectional view of the specimen; and FIG. 3 is a schematic illustration of the method of measuring adhesive strength of a cured epoxy resin using the specimen prepared in Eamples (corresponding to Examples).

DETAILED DESCRIPTION OF THE INVENTION

The epoxy resin composition according to the present invention is obtained by mixing a low-viscosity epoxy resin with the above-described acid anhydride hardener which is an imide oligomer having an acid anhydride group at the terminal.

The low-viscosity epoxy resins which can be used in the present invention include those containing two epoxy groups per molecule and having a viscosity of about 0.01 to 120 P (poise) at room temperature (25° C.). Examples of suitable epoxy resins are:

an epoxy compound Araldite CY177 (available from Vantico Corp.) represented by formula III:

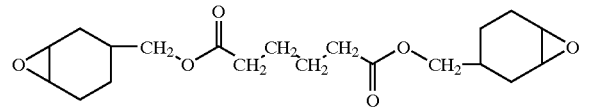

(III)

an epoxy compound Araldite CY179 (available from Vantico Corp.) represented by formula IV:

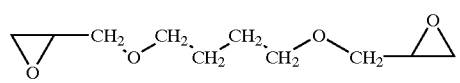

(IV)

and an epoxy compound Araldite DY022 (available from Nagase Chemtech Corp.) represented by formula V:

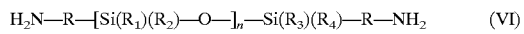

(V)

The asymmetric aromatic tetracarboxylic dianhydride or alicyclic tetracarboxylic dianhydride which provides A moiety of, the acid anhydride hardener used in the present invention includes asymmetric aromatic tetracarboxylic dianhydrides, such as 2,3,3',4'-biphenyltetracarboxylic dianhydride, hydrogenated products of symmetric aromatic tetracarboxylic dianhydrides, such as dicyclohexyl-3,3',4,4'-tetracarboxylic dianhydride that is obtained from tetramethyl 3,3',4,4'-biphenyltetracarboxylate by reduction with hydrogen followed by hydrolysis under heat and pressure and followed by dehydration, and alicyclic tetracarboxylic dianhydride (Epiclon B4400) represented by formula II:

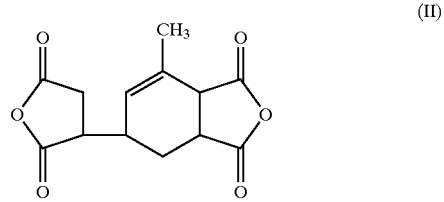

(II)

The diaminopolysiloxane which provides B moiety of,, the acid anhydride hardener includes a diaminopolysiloxane represented by formula VI:

$$H_2N-R-[Si(R_1)(R_2)-O-]_n-Si(R_3)(R_4)-R-NH_2 \quad (VI)$$

wherein R represents a divalent hydrocarbon residue such as a di- to hexamethylene group or a phenylene group; $R_1$, $R_2$, $R_3$, and $R_4$ each represent a lower alkyl group having 1 to 5 carbon atoms or a phenyl group; and n represents an integer of 3 to 60.

Examples of the diaminopolysiloxane are α,ω-bis(2-aminoethyl)polydimethyl-siloxane, α,ω-bis(3-aminopropyl) polydimethylsiloxane, α,ω-bis(4-aminophenyl)poly-dimethylsiloxane, α,ω-bis(4-amino-3-methylphenyl) polydimethylsiloxane, α,ω-bis(3-aminopropyl) polydiphenylsiloxane, and α,ω-bis(4-aminobutyl) polydimethylsiloxane.

As long as the effects of the invention are not impaired, part of the diaminopolysiloxane may be displaced with other diamines.

The acid anhydride hardener used in the present invention which is an imide oligomer having an acid anhydride group at the terminal thereof has an A moiety (the asymmetric aromatic tetracarboxylic dianhydride residue or the alicyclic tetracarboxylic dianhydride residue) to B moiety (the diaminopolysiloxane residue) molar ratio of preferably 1.2 to 5. The lower limit of the A to B molar ratio is more preferably 1.5, and the upper limit is more preferably 3, most preferably 2.

The imide oligomer has a number-average molecular weight by GPC (converting to a polystyrene basis) of 10,000 or lower, preferably 6,000 or lower.

The imide oligomer having an acid anhydride residue at the terminal is preferably obtainable by once half-esterifying the asymmetric aromatic tetracarboxylic dianhydride or alicyclic tetracarboxylic dianhydride, (A moiety) with an esterifying agent, particularly a primary alcohol having 4 or less carbon atoms under reflux for about 0.5 to 24 hours, cooling the reaction mixture, adding a diaminopolysiloxane (B moiety) to the reaction mixture at an A/B molar ratio of preferably 1.2 to 5 (wherein the lower limit is more preferably 1.5, and the upper limit is more preferably 3, most preferably 2) heating the mixture in an inert gas stream first to evaporate the primary alcohol used for half-esterification in the initial stage and then to a, temperature of 130° C. or higher but lower than 250° C., particularly 160 to 210° C., for about 0.5 to 24 hours while stirring to cause dehydration by one-pot reaction, and cooling the reaction mixture to give a substantially solvent-free product.

The esterifying agent for the half-esterification includes compounds having one alcoholic hydroxyl group, such as, methanol, ethanol, isopropyl alcohol, butanol, ethyl cellosolve, butyl cellosolve, propylene glycol ethyl ether, and ethyl carbitol, particularly aliphatic alcohols having 4 or less carbon atoms, wherein primary alcohols are preferable.

The esterifying agent such as an aliphatic alcohol having 4 or less carbon atoms is preferably used in an amount of about 20 to 1000 parts by weight per 100 parts by weight of the tetracarboxylic dianhydride providing A moiety.

The epoxy resin composition comprising the low-viscosity epoxy resin and the acid anhydride hardener (imide oligomer having an acid anhydride group at the terminal) can further comprise other hardeners and accelerators.

Other useful hardeners include alicyclic acid anhydride hardeners and phenolic resin hardeners. Useful accelerators include hydrazides and imidazole compounds. For obtaining a solventless epoxy resin composition, it is particularly suitable in the present invention to use an alicyclic acid anhydride hardener Epicure YH306, available from Japan Epoxy Resin Co., Ltd.

If desired, the epoxy resin composition can further contain appropriate amounts of various anti-foaming agents, silane coupling agents, organic or inorganic fillers, pigments, and the like.

The compounding ratio of the components in the epoxy resin composition of the present invention is decided so that the resulting composition may keep a liquid state at relatively low temperatures around room temperature (25° C.) without the aid of a solvent. A suitable amount of the imide oligomer having an acid anhydride group at the terminal is such that the total amount of the siloxane moiety is about 10 to 500 parts by weight per 100 parts by weight of the low-viscosity epoxy resin. An acid anhydride hardener that is an imide oligomer having an acid anhydride group at the terminal thereof is preferably present in an amount of 5% by weight or more based on the epoxy resin composition and of one equivalent or less per equivalent of the total epoxy group content.

In using the alicyclic acid anhydride hardener and/or the phenolic resin hardener in combination, the total content of the functional groups of all hardeners is preferably equivalent or less, particularly 0.9 to 1 equivalent per equivalent of total epoxy group content of the low-viscosity epoxy resin. In using the accelerators, the amout is preferably 0.1 to 10 parts by weight per 100 parts by weight of the low-viscosity epoxy resin.

The amount of the silane coupling agent is preferably about 0.1 to 25 parts by weight per 100 parts by weight of the low-viscosity epoxy resin. Amounts of other additives, if added, are decided appropriately with reference to the techniques common in known one-pack type epoxy resin compositions.

It is suitable for the one-pack type epoxy resin composition of the present invention to have a viscosity of 250 P or less at 25° C., preferably about 0.1 to 250 P at 25° C. in view of molding properties, such as capability of penetrating at 50 to 100° C. in a relatively short time, and sealing properties.

In a preferred mode of curing the one-pack type epoxy resin composition, the composition is applied to an electronic component having a semiconductor chip, an insulating film, and a conductor formed on the insulating film in a pattern by spin coating, screen printing, dip coating, spray coating or a like method to form a dry film thickness of about 10 to 500 μm and cured by heating in two stages, first at about 65 to 150° C. for about 10 to 120 minutes and; then at about 150 to 200° C. for about 1 to 8 hours. This cured resin has a tensile modulus of 200 kg/mm² or less at 25° C.

Having the above-described composition and a low viscosity, the one-pack epoxy resin composition of the present invention is useful as an insulating material for electronic components. The characteristics of the composition are especially taken advantage of for use as an underfill material having a low elastic modulus.

FIG. 1 is a schematic illustration of a semiconductor chip sealed with an underfill. material which is a cured resin of the solventless one-pack type epoxy resin composition of the present invention. In FIG. 1, 1 denotes a cured resin as an underfill material obtained by curing the solventless one-pack type epoxy resin composition of the present invention. 2 denotes a semiconductor chip. 3 denotes a polyimide film substrate. 4 denotes a bump. 5 denotes a wiring.

The present invention will now be illustrated in greater detail with reference to Examples, but it should be understood that the present invention is not construed as being limited thereto. In Examples, the viscosity of acid anhydride hardeners (imide oligomer) was measured with a cone-plate viscometer at 60° C. The viscosity and penetration time of the epoxy resin. compositions and the tensile modulus and adhesive strength of cured resins were measured as follows.

a) Viscosity of Epoxy Resin Composition

Measured with a cone-plate viscometer at 25° C.

b) Penetration Time of Epoxy Resin Composition

A glass cell for liquid crystal evaluation having a cell gap of 20 μm, available from E. H. C., was used. The cell was placed on a 80° C. hot plate, and the time required for a resin composition to penetrate into the gap to a depth of 1 cm was measured.

good: The penetration time is 120 seconds or shorter.

c) Tensile Modulus of Cured Resin

A 4 mm wide dumbbell specimen blanked out of a cured resin was used. Measurement was made using TENSILON UTM-II-20 supplied by Orientec Corp. at a chuck distance of 30 mm and a pulling speed of 2 mm/min in accordance with ASTM D882.

d) Adhesive Strength of Cured Resin

A specimen shown in FIG. 2 was prepared. A one-pack type epoxy resin composition 1 was dropped on the middle of a 1 cm wide, 10 cm long and 25 μm thick polyimide film 30, and a 1 cm-side square of a silicon wafer 20 was placed thereon. ,The resin composition was cured by heating on a 135° C. hot plate for 15 minutes and then in a 180° C. oven for 1 hour. As shown in FIG. 3, the specimen was set on a tensile tester with the polyimide film 30 up and with the silicon wafer 20 sticking out by 2 mm from the edge of the upper presser foot 40. The polyimide film 30 was pulled up at a speed of 2 mm/min, and the load at the time when the film peeled off the silicon wafer was taken as an adhesive strength.

good: No break is observed in the cured epoxy resin. (The silicon wafer broke.)

In FIG. 2 and FIG. 3, 20 denotes a silicon wafer. 30 denotes polyimide film. 40 denotes an upper presser. 50 denotes a jig. 60 denotes a spacer.

Synthesis Example

In a four-necked flask equipped with a stirrer, an inlet for introducing nitrogen, a reflux condenser, and a stopper, 37.90 g(143.4 mmol) of Epiclon. B4400 (alicyclic tetracarboxylic dianhydride available from Dainippon Ink & Chemicals, Inc.) and 50 g of methanol were put and refluxed for 3 hours, followed by cooling to room temperature. The reflux condenser was replaced with one equipped with a water separator, and 0.10 g of an anti-foaming agent FS Antifoam DB-100 (available from Dow Corning Asia) and 64.68 g (71.71 mmol) of a diaminopolysiloxane BY16-853U (amino-modified silicone oil; in formula VI, R=$C_3H_6$; $R_1$=$R_2$=$R_3$=$R_4$=$CH_3$; amine equivalent: 451; available from Dow Corning Toray Silicone Co., Ltd.) were added to the reaction mixture. After methanol was removed by evaporation over a 1-hour period, the temperature was raised up to 190° C. to allow the mixture to react for 1 hour while removing produced water to give 97.89 g (yield:

97.90%) of a brown viscous substance, which was designated SiB. The viscosity of SiB at 60° C. was 311 P.

EXAMPLE 1

A hundred gram of a low-viscosity epoxy resin Araldite DY022 (available from Nagase Chemtech Corp.), 131 g of the acid anhydride hardener SiB prepared in Synthesis Example, 132 g of an alicyclic acid anhydride hardener Epicure YH306 (available from Japan Epoxy Resin Co., Ltd.), 1 g of a accelerator Curesol 2E4MZ (available from Shikoku Chemicals Corp.), and 7.3g of a silane coupling agent KBM403 (available from Shin-Etsu Chemical Co., Ltd.) were mixed uniformly. The mixture was filtered through FILTER PAPER 408 (pore size: 5 $\mu$m; available from ADVANTEC TOYO) and vacuum-degassed. The resulting solventless one-pack type epoxy resin composition had a viscosity of 5.4 P at 25° C. and showed satisfactory penetrability into the 20 $\mu$m gap.

The resin composition was cured on a 100° C. hot plate for 1 hour and then in a 180° C. oven for 2 hours. The cured resin had a tensile modulus of 2.0 kg/mm². The adhesive strength was unmeasurably high to cause the silicon wafer to break during measurement.

EXAMPLES 2 AND 3 AND

Comparative Example

A solventless one-pack type epoxy resin composition was obtained in the same manner as in Example 1, except for using Araldite CY177 or Araldite CY179 (available from Vantico Corp.) in place of Araldite DY022 and changing the compounding ratio as shown in Table 1 below. The resulting resin composition and its cured product were evaluated in the same manner as in Example 1. The results obtained are shown in Table 1.

TABLE 1

|  | Example 1 | Example 2 | Example 3 | Comparative Example |
|---|---|---|---|---|
| Composition (g): | | | | |
| Araldite DY022 | 100 | | | 100 |
| Araldite CY177 | | 100 | | |
| Araldite CY179 | | | 100 | |
| SiB | 131 | 87.2 | 127 | |
| Epicure YH306 | 132 | 87.8 | 128 | 176 |
| Curesol 2E4MZ | 1 | 1 | 1 | 1 |
| KBM403 | 7.3 | 5.5 | 7.1 | 5.5 |
| Results of Evaluation: | | | | |
| Viscosity (P) | 5.4 | 27.2 | 23.8 | 1.8 |
| Penetrability into 20 $\mu$m Gap | good | good | good | good |
| Adhesive Strength | good | good | good | good |
| Tensile Modulus (kg/mm²) | 2.0 | 114 | 120 | 161 |

The results in Table 1 prove that the solventless one-pack type epoxy resin composition and its cured product according to the present invention exhibit a reduced modulus as compared with Comparative Example while retaining satisfactory molding properties and adhesion.

EXAMPLE 4

A solventless one-pack type epoxy resin composition was obtained in the same manner as in Example 1, except for using Araldite DY026SP (available from Vantico Corp.), which is a purer product than Araldite DY022, in place of Araldite DY022 and changing the compounding ratio as shown in Table 2 below. The resulting resin composition and its cured product were evaluated in the same manner as in Example 1. The results obtained are shown in Table 2.

TABLE 2

|  | Example 4 |
|---|---|
| Composition (g): | |
| Araldite DY026SP | 100 |
| SiB | 140 |
| Epicure YH306 | 141 |
| Curesol 2E4MZ | 1 |
| KBM403 | 7.6 |
| Results of Evaluation: | |
| Viscosity (P) | 3.1 |
| Penetrability into 20 $\mu$m Gap | good |
| Adhesive Strength | good |
| Tensile Modulus (kg/mm²) | 23 |

The dielectric constant and volume resistivity of the cured resins obtained in Examples 1 to 4 were measured as follows. The results obtained are shown in Table 3 below.

e) Dielectric Constant

Measured on an about 1 mm thick cured resin with an automatic dielectric loss measuring apparatus R-1100, supplied by Ando Electric Co., Ltd., at 23° C. and 1 kHz.

f) Volume Resistivity

Measured on an about 1 mm thick cured resin with a dynamic condenser electrometer TR-8411, supplied by Advantest Corp. at an applied voltage of 100 V and 23° C.

TABLE 3

|  | Example 1 | Example 2 | Example 3 | Example 4 |
|---|---|---|---|---|
| Dielectric Constant | 3.6 | 3.2 | 3.0 | 3.4 |
| Volume Resistivity ($\Omega \cdot$ cm) | $9.8 \times 10^{12}$ | $1.7 \times 10^{16}$ | $1.6 \times 10^{16}$ | $1.8 \times 10^{15}$ |

Having been described in detail, the present invention provides a solventless one-pack type epoxy resin composition which provides a cured resin having a small elastic modulus and good adhesion to both a silicon wafer and a polyimide film and which exhibits satisfactory molding properties in terms of a low viscosity and ability to penetrate in a relatively short time. The present invention also provides a cured resin having a low elastic modulus and a high adhesive strength.

The, invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

This application claims priority of Japanese Patent Application Nos. 2000-291885 filed Sep. 26, 2000 and 2000-355172 filed Nov. 22, 2000 which are incorporated herein by reference.

What is claimed is:

1. A one-pack type epoxy resin composition comprising a low-viscosity epoxy resin and an acid anhydride hardener that is an imide oligomer comprising an imide unit and having an acid anhydride group at the terminal thereof, said imide unit being represented by formula I:

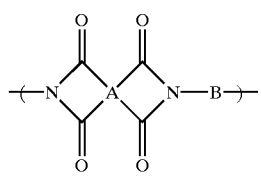

(I)

wherein A represents an asymmetric aromatic tetracarboxylic dianhydride residue or alicyclic tetracarboxylic dianhydride residue; and B represents a diaminopolysiloxane residue, and has a viscosity of 250 P or less at 25° C.

2. A one-pack type epoxy resin composition according to claim 1, wherein said imide oligomer has an A moiety to B moiety molar ratio of 1.2 to 5.

3. A one-pack type epoxy resin composition according to claim 1, wherein said imide oligomer is one obtainable by once half-esterifying an asymmetric aromatic tetracarboxylic dianhydride or alicyclic tetracarboxylic dianhydride (A moiety) with an esterifying agent, and then adding a diaminopolysiloxane (B moiety) to the reaction mixture at an A moiety to B moiety molar ratio of 1.2 to 5 to cause the reaction mixture to dehydrate until substantially no solvent remains in the reaction system.

4. A one-pack type epoxy resin composition according to claim 3, wherein said esterifying agent for the half-esterification is an aliphatic alcohol having 4 or less carbon atoms.

5. A one-pack type epoxy resin composition according to claim 3, wherein said acid anhydride hardener is an imide oligomer having an acid anhydride group at the terminal thereof which is obtainable by using an alicyclic tetracarboxylic dianhydride represented by formula II:

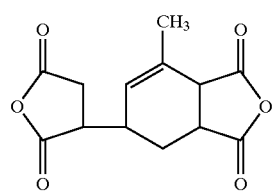

(II)

6. A one-pack type epoxy resin composition according to claim 1, wherein said acid anhydride hardener is present in an amount of 5% by weight or more based on the composition and of 1 equivalent or less per equivalent of the total epoxy group content.

7. A one-pack type epoxy resin composition according to claim 1, which further comprises an alicyclic acid anhydride hardener, a phenolic resin hardener or both in such an amount that the total content of the functional groups of all hardeners is 1 equivalent or less per equivalent of total epoxy group content of said low-viscosity epoxy resin.

8. A one-pack type epoxy resin composition according to claim 1, which thermally cures to provide a cured resin having a tensile modulus of 200 kg/mm$^2$ or less at 25° C.

9. A one-pack type epoxy resin composition according to claim 1, which further comprises a silane coupling agent.

10. A one-pack type epoxy resin composition according to claim 1, which is used as an underfill material for an electronic component.

11. A cured resin obtainable by thermally curing a one-pack type epoxy resin composition according to claim 1.

* * * * *